(12) United States Patent
Walker

(10) Patent No.: US 6,206,769 B1
(45) Date of Patent: Mar. 27, 2001

(54) METHOD AND APPARATUS FOR STOPPING MECHANICAL AND CHEMICAL MECHANICAL PLANARIZATION OF SUBSTRATES AT DESIRED ENDPOINTS

(75) Inventor: Michael A. Walker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/222,572

(22) Filed: Dec. 28, 1998

Related U.S. Application Data

(62) Division of application No. 08/761,648, filed on Dec. 6, 1996, now Pat. No. 5,855,804.

(51) Int. Cl.[7] ........................................................ B24B 7/22
(52) U.S. Cl. ............................................. 451/288; 451/41
(58) Field of Search ................................ 451/41, 288, 287, 451/37, 57

(56) References Cited

U.S. PATENT DOCUMENTS

| 5,064,683 | * | 11/1991 | Poon et al. | 427/39 |
| 5,314,843 | * | 5/1994 | Yu et al. | 437/225 |
| 5,609,719 | * | 3/1997 | Hempel | 156/636.1 |

* cited by examiner

Primary Examiner—Robert A. Rose
(74) Attorney, Agent, or Firm—Dorsey & Whitney LLP

(57) ABSTRACT

A method and apparatus for forming a planar surface on a substrate at a desired endpoint. In one embodiment of the invention, material is removed from a substrate with an abrasive medium on a planarizing surface. As material is removed from the substrate, the abrasive medium is selectively inhibited from contacting a first exposed area at the desired endpoint on the substrate while it still contacts a second area on the substrate that is not yet at the endpoint. In this embodiment of the invention, therefore, polishing substantially stops at the first area on the substrate but continues at the second area on the substrate.

9 Claims, 2 Drawing Sheets

METHOD AND APPARATUS FOR STOPPING MECHANICAL AND CHEMICAL MECHANICAL PLANARIZATION OF SUBSTRATES AT DESIRED ENDPOINTS

CROSS-REFERENCE TO RELATED APPLICATION

This application is a divisional of U.S. patent application Ser. No. 08/761,648, filed Dec. 6, 1996 now U.S. Pat. No. 5,855,804.

TECHNICAL FIELD

The present invention is related to mechanical and chemical-mechanical planarization of substrates, and more particularly, to a method and apparatus for consistently stopping planarization of substrate at a desired endpoint.

BACKGROUND OF THE INVENTION

Chemical-mechanical planarization ("CMP") processes remove material from the surface of a semiconductor wafer in the production of integrated circuits. FIG. 1 schematically illustrates a CMP machine 10 with a platen 20, a wafer carrier 30, a polishing pad 40, and a planarizing liquid 44 on the polishing pad 40. The polishing pad 40 may be a conventional polishing pad made from a continuous phase matrix material (e.g., polyurethane), or it may be a new generation fixed-abrasive polishing pad made from abrasive particles fixedly dispersed in a suspension medium. The planarizing liquid 44 may be a conventional CMP slurry with abrasive particles and chemicals that remove material from the wafer, or the planarizing liquid 44 may be a planarizing solution without abrasive particles.

The CMP machine 10 also may have an under-pad 25 attached to an upper surface 22 of the platen 20 and the lower surface of the polishing pad 40. A drive assembly 26 rotates the platen 20 (as indicated by arrow A), or it reciprocates the platen 20 back and forth (as indicated by arrow B). Since the polishing pad 40 is attached to the under-pad 25, the polishing pad 40 moves with the platen 20.

The wafer carrier 30 has a lower surface 32 to which a wafer 12 may be attached, or the wafer 12 may be attached to a resilient pad 34 positioned between the wafer 12 and the lower surface 32. The wafer carrier 30 may be a weighted, free-floating wafer carrier, or an actuator assembly 36 may be attached to the wafer carrier to impart axial and/or rotational motion (as indicated by arrows C and D, respectively).

To planarize the wafer 12 with the CMP machine 10, the wafer carrier 30 presses the wafer 12 face-downward against the polishing pad 40. While the face of the wafer 12 presses against the polishing pad 40, at least one of the platen 20 or the wafer carrier 30 moves relative to the other to move the wafer 12 across the planarizing surface 42. As the face of the wafer 12 moves across the planarizing surface 42, material is continuously removed from the face of the wafer 12.

In the competitive semiconductor industry, it is desirable to consistently stop CMP processing of a run of wafers at a desired endpoint and to produce a uniform, planar surface on each wafer. Accurately stopping CMP processing at a desired endpoint is important to maintaining a high throughput of planarized wafers because the thickness of the planarized layer on the wafer must be within an acceptable range. It will be appreciated that if the thickness of the planarized layer is not within its acceptable range, the wafer must be re-planarized until it reaches a desired endpoint. Additionally, it is important to accurately produce a uniform, planar surface on each wafer to enable precise circuit and device patterns to be formed with photolithography techniques. The critical dimensions of many photo-patterns must be focused within a tolerance of approximately 0.1 μm. Focusing photo-patterns to such small tolerance, however, is difficult when the planarized surface of the wafer is not uniformly planar. Therefore, two primary objectives of CMP processing are stopping planarization at a desired endpoint and producing a highly uniform, planar surface on each wafer.

CMP processing involves many operating parameters that affect the planarity of the surface on the wafer and the ability to stop CMP processing at the desired endpoint. The rate at which material is removed from the surface of the wafer (the "polishing rate") often varies across the face of a wafer and from one wafer to another. The most common parameters that affect the polishing rate of a wafer are: (1) the relative velocity gradient between the wafer and the polishing pad across the face of the wafer; (2) the distribution of slurry across the surface of the wafer; (3) the composition of materials across the wafer; (4) the topography of the wafer; (5) the parallelism between the face of the wafer and the surface of the polishing pad; (6) the temperature gradient across the face of the wafer; and (7) the condition of the planarizing surface of the polishing pad. The polishing rate may vary across the face of the wafer because any one of the operating parameters may change during planarization. Moreover, the polishing rate may vary from one wafer to another because it is difficult to identify and correct changes in specific operating parameters. Thus, it is difficult to consistently stop CMP processing at a desired endpoint on a wafer by estimating the time-to-polish using the polishing rate of previous wafers.

One desirable technique of endpointing CMP processing is the stop-on-feature ("SOF") wafer design. A typical SOF wafer has a polish-stop layer at a desired endpoint on the wafer and a cover layer over the polish-stop layer. The polish-stop layer is made from a material that has a low polishing rate relative to the polishing rate of the cover layer; high regions of the cover layer are accordingly removed faster than lower, exposed portions of the polish-stop layer. The objective of the polish-stop layer, therefore, is to prevent or slow further polishing beyond the high point of the polish-stop layer.

Although SOF wafers are a promising technique to end-point CMP processing, they may not consistently stop CMP processing at a desired endpoint in some applications. In conventional SOF wafers, the polishing rate of the polish-stop layer is less than that of the cover layer because the polish-stop layer is harder than the cover layer (to inhibit mechanical removal) and/or the polish-stop layer has a lower etch rate in the planarizing solution than the cover layer (to inhibit chemical removal). Although the polishing rate of the polish-stop layer is lower than the cover layer, material is still generally removed from the exposed portions of the polish-stop layer. The removal of material from the polish-stop layer is a particularly acute problem for thin polish-stop layers because exposed portions of thin polish-stop layers may be completely removed from the wafer, thereby destroying the structure protected by the polish-stop layer. The removal of material from the polish-stop layer also reduces the uniformity of the planarized surface. Therefore, conventional SOF wafers may not consistently stop CMP processing at a desired endpoint with conventional CMP processing methods.

SUMMARY OF THE INVENTION

In one embodiment of the invention, material is removed from a substrate with an abrasive medium on a planarizing surface. As a material is removed from the substrate, the abrasive medium is selectively inhibited from contacting a first exposed area at the desired endpoint on the substrate while it still contacts a second area on the substrate that is not yet at the endpoint. In this embodiment of the invention, therefore, polishing substantially stops at the first area on the substrate but continues at the second area on the substrate.

In a preferred embodiment of the invention, a semiconductor substrate has a hydrophobic polish-stop stratum at a desired endpoint of the substrate, and a hydrophilic cover layer on the hydrophobic polish-stop stratum. To remove material from the surface of the semiconductor substrate, the hydrophilic layer is pressed against a hydrophobic planarizing surface of a polishing pad in the presence of an abrasive slurry, and at least one of the semiconductor substrate or the polishing pad is moved with respect to the other to impart relative motion therebetween. As material is removed from the hydrophilic layer, a portion of the hydrophobic stratum is often exposed at a first area on the substrate. The hydrophobic stratum at the first area and the hydrophobic planarizing surface substantially inhibit the abrasive slurry from contacting the surface of the hydrophobic stratum at the first area. Thus, the preferred embodiment of the invention substantially prevents removal of material from exposed areas of the hydrophobic stratum while continuing to remove material from the hydrophilic layer.

DETAILED DESCRIPTION OF THE INVENTION

Figure 2:
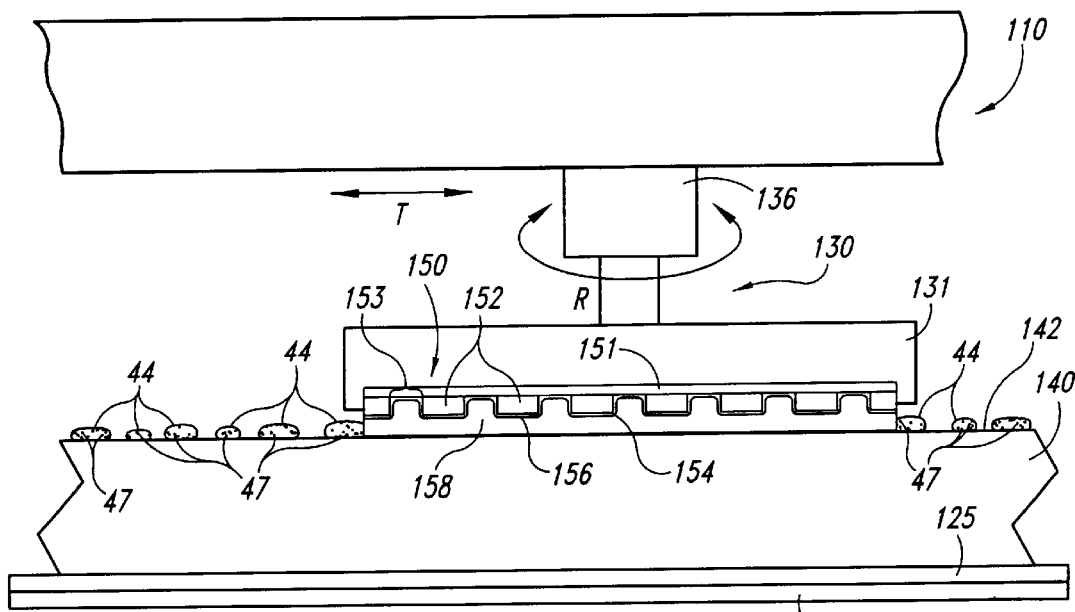
FIG. 2 is a partial schematic cross-sectional view of a chemical-mechanical planarizing machine in accordance with an embodiment of the invention.
Figure 3:
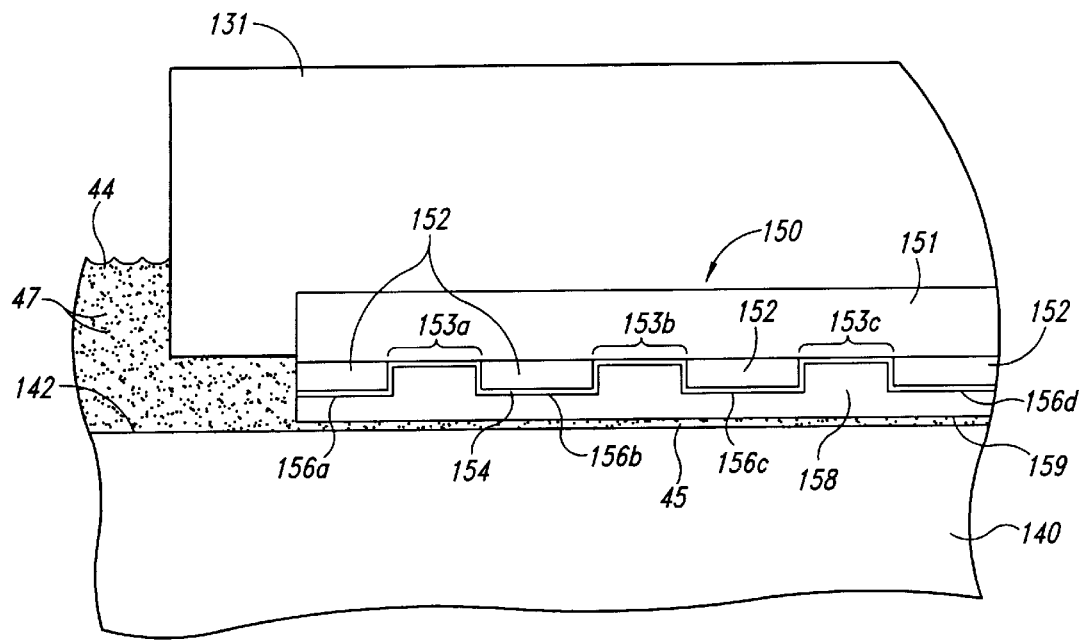
FIG. 3 is a partial cross-sectional view of the chemical-mechanical planarization machine of FIG. 2 at one point in accordance with an embodiment of a method of the invention.
Figure 4:
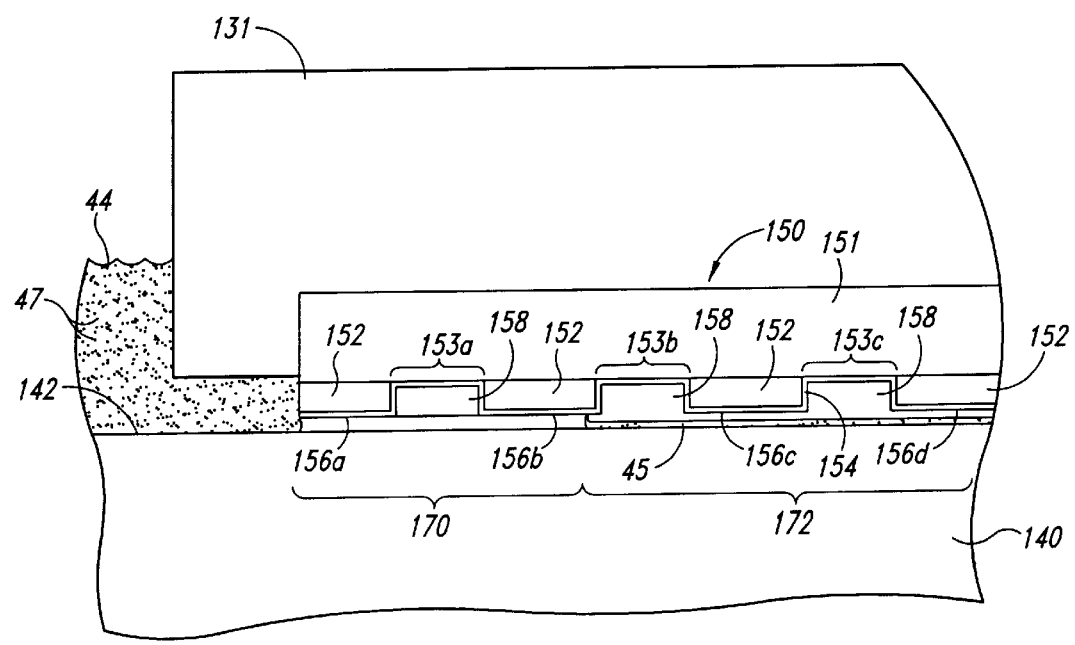
FIG. 4 is a partial schematic cross-sectional view of the chemical-mechanical planarization machine of FIG. 2 at another point of an embodiment of a method of the invention.

The preferred embodiment of the present invention is an apparatus and method for consistently stopping CMP processing at desired endpoints on semiconductor wafers, baseplates for field emission displays, and other related substrates. An important aspect of the preferred embodiment of the invention is to provide a substrate with a hydrophobic polish-stop stratum at a desired endpoint of the substrate and a hydrophilic cover layer over the hydrophobic polish-stop stratum. The hydrophobic polish-stop stratum and the hydrophilic cover layer also preferably have the desired electrical properties to be component parts of the integrated circuits formed on the semiconductor substrate. Another important aspect of the preferred embodiment of the invention is to planarize the substrate on a polishing pad with a hydrophobic planarizing surface. In operation, planarization virtually stops at exposed areas of the hydrophobic polish-stop stratum because the hydrophobic stratum and the hydrophobic planarizing surface repel aqueous solutions to substantially inhibit the chemicals and the abrasive particles in the aqueous solutions from contacting exposed areas of the hydrophobic polish-stop stratum. Therefore, the preferred embodiment of the invention provides a self-limiting endpoint for CMP processing that consistently stops planarization at the hydrophobic polish-stop stratum. FIGS. 2–4, in which like reference numbers refer to like parts throughout the various views, illustrate a planarizing system and a method of using the planarizing system in accordance with a preferred embodiment of the invention.

Figure 1:
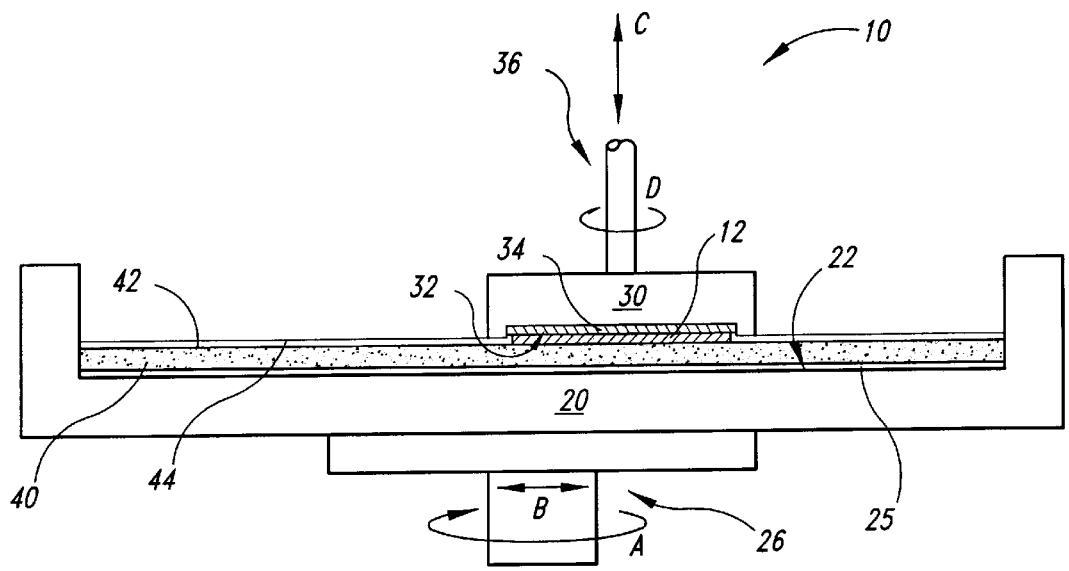
FIG. 1 is a schematic cross-sectional view of a chemical-mechanical planarization machine in accordance with the prior art.

FIG. 2 is a schematic cross-sectional view of a preferred embodiment of a chemical-mechanical planarization machine 110 and a substrate 150. The chemical-mechanical planarization machine 110 has a platen 120, an underpad 125 attached to the platen 120, a polishing pad 140 attached to the underpad 125, and a wafer carrier 130 positioned over the polishing pad 140. As discussed above with respect to FIG. 1, an actuator 126 moves the platen 120 and another actuator 136 moves a wafer holder 131 of the wafer carrier 130. The substrate 150 is mounted to the wafer holder 131, and the wafer carrier 130 moves the substrate 150 across the polishing pad 140 to remove material from the substrate 150. In the preferred embodiment of the invention, the polishing pad 140 and the substrate 150 interact with one another to selectively self-limit planarization of areas on the substrate at the desired endpoint.

The polishing pad 140 preferably has a hydrophobic planarizing surface 142 facing the substrate 150. The polishing pad 140 may be wholly made from a hydrophobic material, or just an upper portion of the polishing pad 140 at the planarizing surface 142 may be hydrophobic. The planarizing surface 142 accordingly lacks affinity to water in the slurry 44 such that the surface tension of the slurry 44 inhibits the slurry from uniformly wetting the planarizing surface 142. Depending upon the hydrophobicity of the planarizing surface, the slurry 44 may "bead" on top of the planarizing surface 142 (shown in FIG. 2). In a preferred embodiment of the invention, the polishing pad is either a non-porous or a porous hydrophobic pad. One suitable non-porous hydrophobic pad is a non-porous polymeric polishing pad, and one suitable hydrophobic porous pad is the Rodel IC-1000 polishing pad, both of which are manufactured by Rodel Corporation of Newark, Del.

The substrate 150 may be a semiconductor wafer, a baseplate for a field emission display, or other related applications that require a uniformly planar surface at a consistent endpoint. The preferred embodiment of the present invention is particularly useful for forming a container capacitor on a DRAM cell as disclosed in U.S. Pat. No. 5,162,248, entitled "Optimized Container Stacked Capacitor DRAM Cell Utilizing Sacrificial Oxide Deposition And Chemical-Mechanical Polishing," which is herein incorporated by reference. The preferred embodiment of the invention, however, may be used for form other structures including, but not limited to, contact plugs and damascene lines.

The substrate 150 preferably has a base 151, a number of features 152 formed on the base 151, and a number of openings 153 between or within the features 152. The specific types of features 152 and openings 153 formed on the base 151 depends upon the specific types of devices being fabricated on the substrate 150. For example, the features 152 may be film stacks that form transistors or other components, or the features 152 may be sections of a relatively thick oxide layer. The openings 153 may be spaces between self-standing features (e.g., conductive lines), or the openings 153 may be contact openings through an oxide layer. The substrate 150 also preferably has a hydrophobic stratum 154 conformably positioned over the features 152 to form polish-stop surfaces 156 at the desired endpoint of CMP processing for the substrate 150. In the case of forming a container capacitor, the hydrophobic stratum 154 is also conformably positioned in the openings 153 (shown in FIG. 2). The substrate 150 also has a relatively thick hydrophilic layer 158 disposed over the hydrophobic stratum 154. The hydrophilic layer 158 is preferably thick enough to completely fill the openings 153 lined with the hydrophobic stratum 154. As discussed in greater detail below, the hydrophobic stratum 154 has a much lower polishing rate on the hydrophobic polishing pad 140 than the hydrophilic layer 158 to substantially stop planarization at he polish-stop surfaces 156.

FIG. 3 is a partial cross-sectional view of the substrate 150 and the hydrophobic polishing pad 140 that further illustrates the planarization of the substrate 150. The hydrophilic layer 158 has a strong affinity for water, and thus a film 45 of slurry 44 wets the surface 159 of the hydrophilic layer 158 as it presses against the hydrophobic planarizing surface 142. As a result, the abrasive particles 47 and the chemicals in the slurry 44 act against the hydrophilic layer 158 to remove material from the surface 159 of the hydrophilic layer 158. The hydrophilicity of the particular hydrophilic layer 158 is preferably selected to adjust the degree to which the slurry 44 wets the surface 159 of the hydrophilic layer 158. Suitable materials for the hydrophilic layer include, but are not limited to, doped and undoped oxides. In a preferred embodiment, the hydrophilic layer 158 is silicon dioxide, plasma TEOS oxide, other forms of TEOS oxides, or borophosphorsilicate glass (BPSG).

Referring still to FIG. 3, the hydrophobic polish-stop stratum 154 preferably has polish-stop surfaces 156(a)–156(d) on top of the features 152 at a level proximate to the desired endpoint for the specific substrate 150. The hydrophobic stratum 154 is preferably made from any hydrophobic material that repels or otherwise lacks affinity for water. More specifically, the hydrophobic stratum 154 is preferably a silicon such as crystalline, polycrystalline, or amorphous silicon. In other embodiment of the invention, silicon hydrophobic stratums may be doped with boron, phosphorus, and/or arsenic to vary the hydrophobicity of the hydrophobic stratum 154 according to the specific application of the substrate 150. In general, higher hydrophobicity (less affinity to water) reduces the polishing rate of the hydrophobic stratum on a hydrophobic polishing pad, while lower hydrophobicity (greater affinity to water) increases the polishing rate of the hydrophobic stratum on a hydrophobic polishing pad.

FIG. 4 is a partial schematic cross-sectional view of the substrate 150 and the polishing pad 140 that illustrates the substrate 150 after some of the hydrophilic layer 158 has been removed from the substrate 150. During planarization, the polishing rate across the hydrophilic layer 158 typically varies causing portions of the hydrophobic polish-stop stratum 154 to become exposed while other portions are still covered with the hydrophilic layer 158. For example, the polish-stop surfaces 156(a) and 156(b) of the hydrophobic stratum 154 may be exposed at a first area 170 on the substrate 150, while the polish-stop surfaces 156(c) and 156(d) are still covered with a portion of the hydrophilic layer 158 at a second area 172. The hydrophobic planarizing surface 142 and the hydrophobic polish-stop surfaces 156(a) and 156(b) either contact each other or are separated by a small distance, and neither the hydrophobic planarizing surface 142 nor the hydrophobic polish-stop stratum 154 wets with water. The combination of the hydrophobic planarizing surface 142 and the hydrophobic polish-stop surfaces 156 of the hydrophobic stratum 154 accordingly inhibits a film 45 of slurry from contacting the portion of the substrate 150 at the first area 170. As a result, the preferred hydrophobicity of the planarizing surface 142 and the polish-stop stratum 154 substantially prevents material from being removed from the exposed polish-stop surfaces 156(a) and 156(b).

Conversely, material continues to be removed from the remaining portion of the hydrophilic layer 158 in the second area 172 because the hydrophilicity of the hydrophilic layer 158 allows it to remain wetted with a film 45 of slurry 44. It will be appreciated that planarization continues in the second area 172 until the polish-stop surfaces 156(c) and 156(d) are exposed to isolate the material of the hydrophilic layer 158 in the openings 153(a)–153(c).

An advantage of a preferred embodiment of the present invention is that it consistently stops CMP processing at a desired endpoint. Unlike conventional SOF processes that rely on the hardness or the etch rate of the polish-stop layer to stop planarization at the desired endpoint, the preferred embodiment of the present invention selectively inhibits the mechanical components and the chemical agents from even acting against the substrate at the areas that have reached the desired endpoint. The preferred embodiment of the present invention virtually shuts down planarization at the areas that have reached the desired endpoint. Therefore, the preferred embodiment of the present invention consistently stops CMP processing at the desired endpoint even when thin polish-stop layers are required in the structure of the substrate.

Another advantage of the preferred embodiment of the present invention is that it enhances the uniformity of the planarized surface. The polish-stop surfaces are preferably formed at a uniform elevation across the face of the wafer. Since the preferred embodiment of the present invention virtually shuts down planarization at the polish-stop surfaces, the polish-stop surfaces substantially prevent planarization beyond the desired endpoint. Thus, the finished surface of the substrate is accordingly substantially uniformly planar at the elevation of the polish-stop surfaces.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A chemical-mechanical planarization system, comprising:
   a support surface;
   a polishing pad positioned on the support surface, the polishing pad having a hydrophobic planarizing surface;
   an aqueous abrasive medium on the planarizing surface;
   a wafer carrier positionable over the polishing pad, wherein at least one of the polishing pad and the wafer carrier moves with respect to the other to impart relative motion therebetween; and
   a substrate having a stratum of hydrophobic material positioned over the substrate at a level substantially proximate to a desired endpoint of the substrate, and a layer of hydrophilic material on the hydrophobic stratum, the hydrophobic stratum having a lower polishing rate against the hydrophobic planarizing surface than that of the hydrophilic layer.

2. The chemical-mechanical planarization system of claim 1 wherein the hydrophobic stratum comprises a silicon.

3. The chemical-mechanical planarization system of claim 2 wherein the hydrophilic material is silicon dioxide.

4. The chemical-mechanical planarization system of claim 2 wherein the hydrophilic material is a TEOS oxide.

5. The chemical-mechanical planarization system of claim 2 wherein the hydrophilic material is BPSG.

6. The chemical-mechanical planarization system of claim 1 wherein the hydrophilic stratum comprises a silicon oxide.

7. The chemical-mechanical planarization system of claim 1 wherein the hydrophilic stratum comprises a silicon, the hydrophilic layer comprises a silicon oxide, and the hydrophobic planarizing surface comprises a non-porous polymer material.

8. The chemical-mechanical planarization system of claim 1 wherein the hydrophobic stratum comprises a silicon, the hydrophilic layer comprises a silicon oxide, and the hydrophobic planarizing surface comprises a porous hydrophobic material.

9. The chemical-mechanical planarization system of claim 1 wherein the substrate comprises a semiconductor wafer.

* * * * *